US011985761B2

(12) United States Patent
Wang et al.

(10) Patent No.: US 11,985,761 B2
(45) Date of Patent: May 14, 2024

(54) CALIBRATION CIRCUIT BOARD AND ANTENNA APPARATUS INCLUDING THE SAME

(71) Applicant: CommScope Technologies LLC, Hickory, NC (US)

(72) Inventors: Xiaotuo Wang, Suzhou (CN); Hangsheng Wen, Suzhou (CN); Xun Zhang, Suzhou (CN); Changfu Chen, Suzhou (CN)

(73) Assignee: CommScope Technologies LLC, Claremont, NC (US)

( * ) Notice: Subject to any disclaimer, the term of this patent is extended or adjusted under 35 U.S.C. 154(b) by 417 days.

(21) Appl. No.: 17/318,514

(22) Filed: May 12, 2021

(65) Prior Publication Data

US 2021/0378091 A1 Dec. 2, 2021

(30) Foreign Application Priority Data

May 29, 2020 (CN) .......................... 202010472391.2

(51) Int. Cl.
*H05K 1/02* (2006.01)
*H01P 5/18* (2006.01)

(52) U.S. Cl.
CPC ........... *H05K 1/0243* (2013.01); *H01P 5/185* (2013.01); *H05K 2201/10098* (2013.01)

(58) Field of Classification Search
CPC ....... H05K 1/0243; H05K 2201/10098; H05K 1/02; H05K 1/11; H05K 1/184; H01P 5/185; H01P 5/187; H01Q 3/267; H01Q 1/38; H01Q 1/50; H04B 17/11; H04B 17/21

USPC ...................................................... 455/67.15
See application file for complete search history.

(56) References Cited

U.S. PATENT DOCUMENTS

2017/0324136 A1* 11/2017 Sun ........................... H01P 5/18
2019/0372221 A1* 12/2019 Wu ........................... H01Q 3/36

OTHER PUBLICATIONS

"Extended European Search Report for European Application No. 21174965.0, dated Oct. 28, 2021, 9 pages".

* cited by examiner

*Primary Examiner* — Shaima Q Aminzay
(74) *Attorney, Agent, or Firm* — Myers Bigel, P.A.

(57) ABSTRACT

A calibration circuit board for an antenna. The calibration circuit board may include: a first metal layer configured to be grounded; a first substrate over the first metal layer; a second substrate over the first substrate; and a plurality of couplers. Each coupler may include: a transmission line provided with an input port and an output port at both ends thereof, respectively; and a coupling line coupled with the transmission line and including two first portions respectively located at both sides of the transmission line, and a second portion connected between the two first portions. The coupling lines may be connected in series to provide a first calibration port and a second calibration port. One of the transmission lines and the coupling lines may be between the first substrate and the second substrate, and the other of the transmission lines and the coupling lines may be over the second substrate.

18 Claims, 6 Drawing Sheets

CALIBRATION CIRCUIT BOARD AND ANTENNA APPARATUS INCLUDING THE SAME

CROSS-REFERENCE TO RELATED APPLICATION

The present application claims the benefit of priority to Chinese Patent Application No. 202010472391.2, filed on May 29, 2020, the entire contents of which are hereby incorporated by reference for all purposes.

TECHNICAL FIELD

The present disclosure relates generally to the field of antennas, and more particularly, to a calibration circuit board and an antenna apparatus including the calibration circuit board.

BACKGROUND

Smart antennas, also known as adaptive array antennas, have found widespread use in modern mobile communication systems. By adjusting the amplitude and phase characteristics of signals transmitted to individual antenna radiating elements (or groups of radiating elements), a smart antenna can generate spatially directional radiation beams such that the antenna main beam is directed in a particular direction of a user. The beam forming network is an important component of a smart antenna. In a base station containing a smart antenna, a signal transmitted by a radio frequency transceiver enters a beam forming network where the signal is divided into multiple paths corresponding to multiple radiating elements or multiple columns of radiating elements. The signals in each path undergo independent adjustments of their amplitude, phase, and delay characteristics. The beam-formed signals in the multiple paths are transmitted to respective radiating elements or respective columns of radiating elements in the radiating unit. Each radiating element or each column of radiating elements generates an independent spatially directional beam, which, after interference and superimposition, may cause a final beam that exhibits good directivity. In some situations, beam forming may be performed in the radio, with each column of radiating elements coupled to a respective port of the radio.

In order to form a desired ideal beam, it is desirable to make sure that the respective transmitting/receiving channels from the radio frequency transceiver to respective radiating elements or respective columns of radiating elements are uniform in terms of their amplitude and phase characteristics, so that the actually obtained beam is consistent with the beam expected to be obtained through adjustment by the beam forming network. However, the individual transmitting and receiving channels may have inconsistent transmission characteristics such that the resulting beam pattern may be different from what is expected even if the desired gain and phase are applied to the individual channels. In addition, during operation of the smart antenna, relative changes may occur between the individual transmitting and receiving channels. Therefore, it is necessary to detect, calibrate, and compensate for differences and variations in transmission characteristics between the transmitting and receiving channels.

SUMMARY

According to an aspect of the present disclosure, a calibration circuit board for an antenna is provided. The calibration circuit board comprises: a first metal layer configured to be grounded; a first substrate disposed over the first metal layer; a second substrate disposed over the first substrate; and a plurality of couplers. Each coupler comprises: a transmission line provided with an input port and an output port at both ends thereof, respectively; and a coupling line coupled with the transmission line and including two first portions respectively located at both sides of the transmission line, as viewed from a direction perpendicular to the calibration circuit board, and a second portion connected between the two first portions. Wherein the coupling lines of the plurality of couplers are connected in series to provide a first calibration port and a second calibration port. Wherein one of the transmission lines and the coupling lines of the plurality of couplers is disposed between the first substrate and the second substrate, and the other of the transmission lines and the coupling lines of the plurality of couplers is disposed over the second substrate.

In some embodiments, the coupling lines of the plurality of couplers are disposed between the first substrate and the second substrate, and the transmission lines of the plurality of couplers are disposed over the second substrate.

In some embodiments, a first portion of a coupling line of at least one of the plurality of couplers has a common portion with a first portion of a coupling line of an adjacent coupler of the plurality of couplers.

In some embodiments, the transmission lines of the respective ones of the plurality of couplers are parallel to each other, and the two first portions of the coupling line of each of the plurality of couplers are coupled in parallel to the transmission line of that coupler.

In some embodiments, the transmission line of each of the plurality of couplers is in the middle of the two first portions of the coupling line of that coupler.

In some embodiments, a length of the first portion of the coupling line of each of the plurality of couplers is equal to a quarter wavelength of a radio frequency signal provided to the transmission line of that coupler.

In some embodiments, a length of the second portion of the coupling line of each of the plurality of couplers is designed to meet impedance matching requirements.

In some embodiments, the transmission lines of the plurality of couplers extend, as viewed in the direction perpendicular to the calibration circuit board, beyond a region where the coupling lines of the plurality of couplers are present.

In some embodiments, all input ports and all output ports of the transmission lines of the plurality of couplers are respectively located at the same side with respect to the region where the coupling lines of the plurality of couplers are present.

In some embodiments, the calibration circuit board further comprises: a third substrate disposed over the second substrate such that the other of the transmission lines and the coupling lines of the plurality of couplers is located between the second substrate and the third substrate; and a second metal layer disposed over the third substrate and configured to be grounded.

In some embodiments, the calibration circuit board is implemented as a multilayer printed circuit board.

In some embodiments, the transmission lines and the coupling lines of the plurality of couplers are metal traces formed on upper and lower sides of the second substrate, respectively.

In some embodiments, the calibration circuit board does not comprise the second substrate, such that the transmission lines and the coupling lines of the plurality of couplers are collectively disposed between the first substrate and the third substrate.

According to another aspect of the present disclosure, there is provided an antenna apparatus, comprising: a plurality of radiating units; a plurality of radio frequency ports; and the calibration circuit board according to any embodiment of the present disclosure, wherein the input port of each coupler of the calibration circuit board is connected to a respective one of the plurality of radio frequency ports, and the output port of each coupler of the calibration circuit board is connected to a respective one of the plurality of radiating units.

Other features of the present disclosure and advantages thereof will become more apparent from the following detailed description of exemplary embodiments of the present disclosure with reference to the accompanying drawings.

BRIEF DESCRIPTION OF THE DRAWINGS

The foregoing and other features and advantages of the present disclosure will become apparent from the following description of the embodiments of the present disclosure in conjunction with the accompanying drawings. The accompanying drawings, which are incorporated herein and form a part of the specification, further serve to explain the principles of the present disclosure and to enable a person skilled in the art to make and use the present disclosure, wherein.

Figure 1:
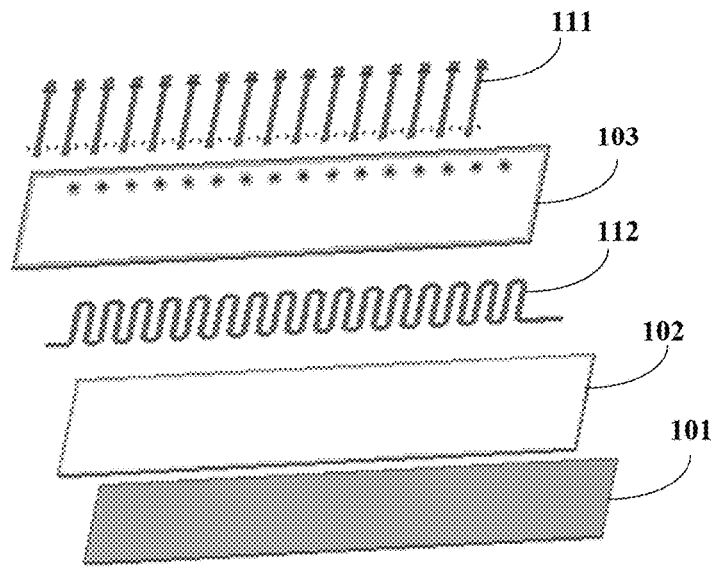
FIG. 1 is an exploded schematic view of a calibration circuit board according to some embodiments of the present disclosure.

Note that in the embodiments described below, sometimes a same reference sign is used in common among different accompanying drawings to denote the same portions or portions having the same function, but a repetitive description thereof will be omitted. In some cases, similar items are denoted using similar reference signs and letters, and thus, once an item is defined in a drawing, it need not be discussed further in subsequent drawings.

For convenience of understanding, the positions, dimensions, ranges and the like of the respective structures shown in the drawings and the like sometimes do not indicate actual positions, dimensions, ranges and the like. Therefore, the present disclosure is not limited to the positions, dimensions, ranges and the like disclosed in the drawings and the like.

DETAILED DESCRIPTION

Various exemplary embodiments of the present disclosure will be described in detail below with reference to the accompanying drawings. It should be noted that: the relative arrangement of parts and steps, numerical expressions and numerical values set forth in these embodiments do not limit the scope of the present disclosure unless specifically stated otherwise.

The following description of at least one exemplary embodiment is merely illustrative in nature and is in no way intended to limit the present disclosure, and its applications or uses. That is, the structures and methods herein are illustrated by way of example to illustrate different embodiments of the structures and methods of the present disclosure. Those skilled in the art will understand, however, that they are merely illustrative of exemplary implementations of the present disclosure but not exhaustive. Furthermore, the drawings are not necessarily drawn to scale, and some features may be exaggerated to show details of particular components.

Additionally, techniques, methods, and devices known to one of ordinary skill in the relevant art may not be discussed in detail but are intended to be part of the granted specification where appropriate.

In all examples illustrated and discussed herein, any particular value should be construed as exemplary only and not as limiting. Thus, other examples of the exemplary embodiments may have different values.

The calibration network of a beam-forming antenna may be used to monitor, potentially in real time, the power and phase of the RF signals input at each port of the smart antenna to ensure that the relative amplitudes and phases of the RF signals received at the different ports are correct, which enables the antenna to operate with the best broadcast beam and service beam for optimal communication. Therefore, the design of the calibration network is very important for the whole smart antenna.

With the rapid development of antenna technology, the number of radio frequency ports and radiating units included in the antenna is increasing. For example, for a 5G massive MIMO (multiple input multiple output) antenna, the number of RF ports included therein will increase from 8 to 16 or even more. The calibration circuit board requires more couplers to cope with the increased number of RF ports and radiating units, which makes the size of the calibration circuit board having a conventional design large, and it is difficult to meet the requirements of high integration and miniaturization of the antenna.

Furthermore, the calibration network itself may introduce amplitude/phase inconsistencies. When channel inconsistencies are observed at the calibration port, it cannot be determined whether the source of the differences is the beam forming network and/or other feed network between the radio frequency transceiver and the radiating units, or the calibration network between the radiating units and the calibration port.

An aspect of the present disclosure provides a calibration circuit board comprising: a first metal layer configured to be grounded; a first substrate disposed over the first metal layer; a second substrate disposed over the first substrate; and a plurality of couplers. Each coupler comprises: a transmission line provided with an input port and an output port at respective ends thereof; and a coupling line coupled with the transmission line and including two first portions respectively located at both sides of the transmission line, as viewed from a direction perpendicular to the calibration circuit board, and a second portion connected between the two first portions. The coupling lines of the plurality of couplers are connected in series to provide a first calibration port and a second calibration port. One of the transmission lines and the coupling lines of the plurality of couplers is disposed between the first substrate and the second substrate, and the other of the transmission lines and the coupling lines of the plurality of couplers is disposed over the second substrate.

The calibration circuit board according to the present disclosure may be used to perform initial calibration of the antenna as well as continuous monitoring and adjustment during normal use of the antenna. The calibration circuit board according to the present disclosure has a plurality of couplers with their coupling lines connected in series to provide two independent calibration ports, which not only has greatly reduced size compared to conventional parallel calibration configurations, but also can be used to eliminate channel differences introduced by the calibration circuit board itself, thereby more accurately detecting amplitude/phase inconsistencies caused by the transmitting/receiving channels. In addition, the transmission lines and the coupling lines of the plurality of couplers included in the calibration circuit board according to the present disclosure are disposed in different layers, with the calibration signals coupling from the transmission lines to the coupling lines of the couplers through one of the substrates. Since the transmission lines and the coupling lines of the couplers can be provided in separate respective layers, the transmission lines and the coupling lines can each have more compact arrangements, thereby further reducing the size of the calibration circuit board.

Figure 2:
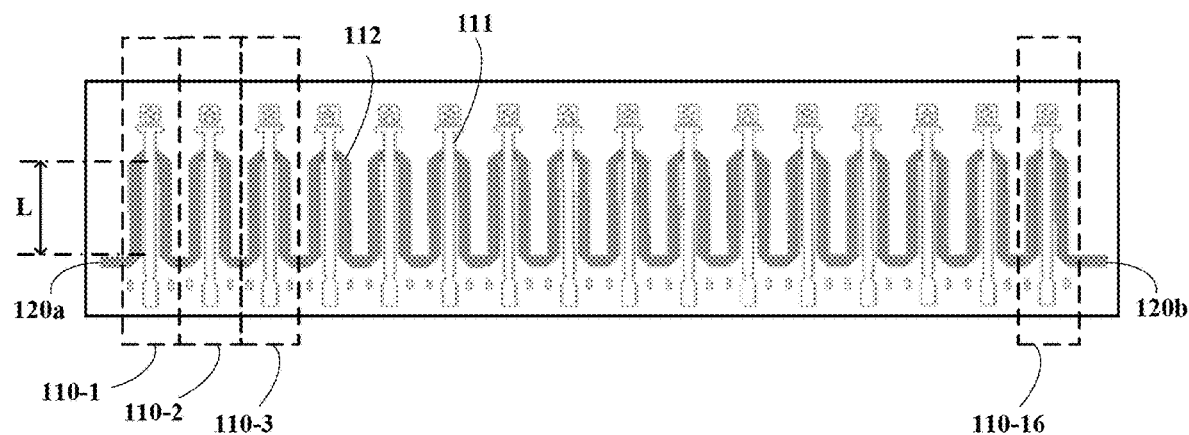
FIG. 2 is a top view of the calibration circuit board of FIG. 1.
Figure 3:
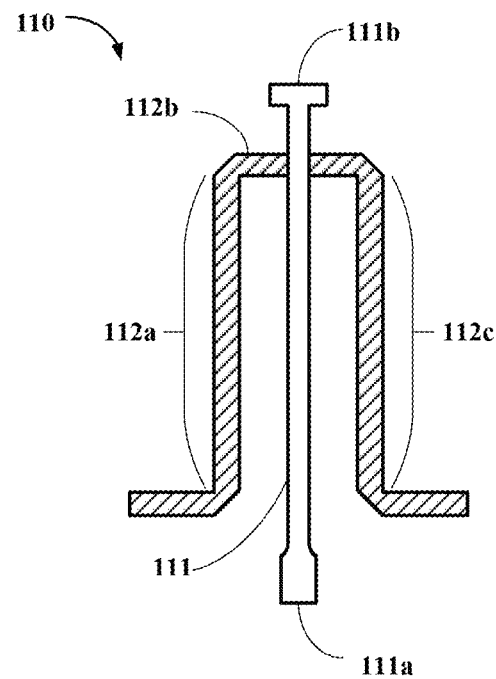
FIG. 3 is an enlarged schematic view of a coupler included in the calibration circuit board of FIG. 1.

Referring now to FIGS. 1-3, a calibration circuit board 100 according to some embodiments of the present disclosure is described in detail. It should be noted that other components may be present in the actual calibration circuit board that are not shown in the drawings and discussed herein in order to avoid obscuring the gist of the present disclosure.

As shown in FIG. 1, the calibration circuit board 100 may include a first metal layer 101, a first substrate 102, and a second substrate 103. The first metal layer 101 is configured to be grounded (i.e., attached to a ground reference voltage). The first substrate 102 is disposed over the first metal layer 101. The second substrate 103 is disposed over the first substrate 102.

Referring to FIG. 2, the calibration circuit board 100 may include a plurality of couplers. For example, FIG. 2 schematically illustrates that the calibration circuit board 100 includes 16 couplers 110-1, 110-2, 110-3, . . . , 110-16, but this is merely an example and is not intended to limit the present disclosure. It can be appreciated that the calibration circuit board 100 may be provided with more or fewer couplers according to actual needs. For example, the number of couplers included in the calibration circuit board 100 may depend on the specific number of ports and/or radiating units in the antenna array to which it is applied. Hereinafter, couplers 110-1, 110-2, 110-3, . . . , 110-16 may be collectively referred to as "couplers 110".

The plurality of couplers 110 may have individual transmission lines 111 and serially connected coupling lines 112. As can be seen in FIGS. 1 and 2, the coupling lines 112 of the plurality of couplers 110 are connected in series with each other. A first end of the first coupler 110-1 acts as a first calibration port 120a and a second end of the last coupler 110-16 acts as a second calibration port 120b. The first calibration port 120a and the second calibration port 120b are capable of providing outputs independently of each other. By connecting the coupling lines 112 of the plurality of couplers 110 in series, the calibration circuit board 100 can have the following ability: when a signal is input to the input port of any one of the couplers 110, coupled components of the input signal can be obtained at both the first calibration port 120a and the second calibration port 120b. The two coupled components are obtained by coupling and transferring the input signal through two different paths, where each path is independent of the other path. For example, for the individual transmitting channels connected to corresponding couplers, the amplitude/phase consistency between the transmitting channels may be determined by comparing the outputs of the first calibration port 120a and the second calibration port 120b. The particular calibration algorithm may employ any suitable algorithm known or later developed in the art without particular limitation by the present disclosure. The two calibration ports 120a and 120b, independent of each other, can be used to eliminate channel differences introduced by the calibration board itself, thereby more accurately detecting amplitude/phase inconsistencies caused by the transmitting/receiving channels.

The transmission lines 111 and the coupling lines 112 of the plurality of couplers 110 may be disposed in different layers. One of the transmission lines 111 and the coupling lines 112 of the plurality of couplers 110 may be disposed between the first substrate 102 and the second substrate 103, and the other of the transmission lines 111 and the coupling lines 112 of the plurality of couplers 110 may be disposed over the second substrate 103. In the non-limiting example shown in FIG. 1, the coupling lines 112 of the plurality of couplers 110 of the calibration circuit board 100 are disposed between the first substrate 102 and the second substrate 103, and the transmission lines 111 of the plurality of couplers 110 are disposed over the second substrate 103.

Since the transmission lines and the coupling lines of the plurality of couplers are disposed in different layers in the calibration circuit board 100, the calibration circuit board may have a more compact arrangement. The area of the calibration circuit board 100 can be reduced by 40% compared to a conventional 16-port series calibration circuit board. Calibration signals may be coupled from the transmission lines 111 to the coupling lines 112 of the couplers through the second substrate 103.

In some embodiments, the first metal layer 101 may take the form of a metal plate. In some embodiments, the first metal layer 101 may be deposited on the lower surface of the first substrate 102, for example, by electroplating. In some embodiments, the first and second substrates 102, 103 may take the form of dielectric plates. In some embodiments, the thickness of the second substrate 103 may be between 20 mil and 40 mil (e.g., 30 mil). The thickness of the second substrate 103 may be specifically set in consideration of the required coupling strength between the transmission line and the coupling line, and the like. In some embodiments, the transmission line 111 and the coupling line 112 may be any one of a coaxial line, a rectangular waveguide, a circular waveguide, a strip line, a microstrip line, and other transmission lines. In some embodiments, the transmission lines 111 and the coupling lines 112 may be formed of a conductive material. In some embodiments, the transmission lines 111 and the coupling lines 112 may be made of a metal such as copper.

For example, taking the calibration circuit board 100 shown in FIG. 1 as an example, in some embodiments, the transmission lines 111 and the coupling lines 112 may be made of a metal foil such as a copper foil, and the coupling lines 112 disposed between the first substrate 102 and the second substrate 103 may be bonded (e.g., by adhesion, etc.) to the upper surface of the first substrate 102 and the lower surface of the second substrate 103 simultaneously, while the transmission lines 111 disposed over the second substrate 103 may be bonded (e.g., by adhesion, etc.) to the upper surface of the second substrate 103. In some embodiments, the first substrate 102 may be a double-sided metal-bonded dielectric substrate, for example, a double-sided copper-bonded dielectric substrate. In such embodiments, the lower surface of the double-sided metal-bonded dielectric substrate 102 may be considered as the first metal layer 101 of the calibration circuit board 100 for grounding, and the metal on the upper surface of the double-sided metal-bonded dielectric substrate 102 may be etched to form the coupling lines 112. In some embodiments, the second substrate 103 may be a double-sided metal-bonded dielectric substrate, for example, a double-sided copper-bonded dielectric substrate. In such embodiments, the metal on the lower surface of the double-sided metal-bonded dielectric substrate 103 may be etched to form the coupling lines 112, and the metal on the upper surface of the double-sided metal-bonded dielectric substrate 103 may be etched to form the transmission lines 111. In some embodiments, the transmission lines and the coupling lines of the plurality of couplers may be metal traces formed on upper and lower sides of the second substrate, respectively. In the embodiments in which the transmission lines and the coupling lines are formed on different surfaces of the second substrate, respectively, when a main functional component of the calibration circuit board 100, such as a coupler, fails, only the second substrate may be replaced without replacing the first substrate and the first metal layer, thereby facilitating repair and/or maintenance and saving costs.

Next, the structure of the coupler 110 is described in detail with reference to FIG. 3. Each coupler 110 may include a transmission line 111 and a coupling line 112. An input port 111a and an output port 111b are provided at respective ends of the transmission line 111. The transmission line 111 may be used to transmit signals between the respective radio frequency port and the respective radiating unit. The input port 111a may be used to receive an RF signal, for example from a beam forming network or other feed network, which is then passed to the corresponding radiating unit via the output port 111b. The coupling line 112 is coupled to the transmission line 111, and includes two first portions (which may also be referred to as coupling portions) 112a and 112c respectively located at both sides of the transmission line 111 as viewed from a direction perpendicular to the calibration circuit board, and a second portion (which may also be referred to as a connecting portion) 112b connected between the two first portions 112a and 112c.

The coupling between the transmission line 111 and the first portions 112a, 112c of the coupling line 112 may be achieved by various known coupling techniques. For example, as shown in FIG. 3, the transmission line 111 may be parallel to the first portions 112a, 112c of the coupling line 112, respectively, so that the coupling between the transmission line 111 and the first portions 112a, 112c of the coupling line 112 may be achieved by means of parallel coupling through the substrate 103. In some embodiments, the transmission lines 111 of the respective ones of the plurality of couplers are parallel to each other, and the two first portions 112a, 112c of the coupling line 112 of each of the plurality of couplers 110 are coupled in parallel to the transmission line 111 of that coupler 110.

In some embodiments, the coupling lines 112 of the plurality of couplers 110 may collectively form a continuous line. As can be seen from FIGS. 1 and 2, for example, the transmission lines 111 of the plurality of couplers 110 are parallel to each other, and the coupling lines 112 of the plurality of couplers 110 may collectively form one continuous serpentine line having a plurality of parallel line segments (serving as coupling portions) that are parallel to each other and parallel to the transmission lines 111 and a plurality of connecting line segments 112b (serving as connecting portions) that connect the plurality of parallel line segments end to end, and two adjacent parallel line segments may be coupled in parallel to each respective transmission line thereabove to form a coupler.

In some embodiments, the transmission line 111 of each of the plurality of couplers 110 is in the middle of the two first portions of the coupling line 112 of that coupler 110. For example, as shown in FIG. 3, the transmission line 111 may be located at an intermediate position between the first portions 112a, 112c of the coupling line 112, as viewed from a direction perpendicular to the calibration circuit board 100. In some embodiments, see for example FIG. 2, the transmission lines 111 of the plurality of couplers 110 extend beyond a region where the coupling lines 112 of the plurality of couplers 110 are present, as seen in a direction perpendicular to the calibration circuit board 100. This has the advantage that the pads formed by providing the input port and output port at opposed ends of the transmission line 111 are outside the region where the coupling lines 112 of the plurality of couplers 110 are present, and not within a region enclosed by the first portions and the second portion of the coupling line, resulting in better flatness of the amplitude of the coupling.

The effective coupling length L of the transmission line 111 and the coupling lines 112 of the coupler 110 may be a projected length of the transmission line 111 on the first portion of the coupling line 112. In some embodiments, the effective coupling length L of the coupler 110 may be equal to a quarter wavelength of a radio frequency signal provided to the transmission line 111 of that coupler 110. In the example shown in FIG. 2, the effective coupling length L of the transmission line 111 and the coupling line 112 of the coupler 110 is the length of the first portion of the coupling line 112. In some embodiments, a length of the first portion of the coupling line of each of the plurality of couplers 110 is equal to a quarter wavelength of an RF signal provided to the transmission line 111 of that coupler 110. For example, referring to FIG. 3, the lengths of the first portions 112a, 112c of the coupling line 112 may be set to a quarter wavelength of an RF signal input at the input port 111a to the transmission line 111. In some embodiments, such as in FIG. 5 described later, the effective coupling length L may be less than the length of the first portion of the coupling line 112. It will be appreciated that the effective coupling length L of the coupler 110 may be set according to specific requirements on the coupling strength of the coupler, etc.

The shape of the second portion 112b is not particularly limited. In some embodiments, a length of the second portion 112b may be designed to meet impedance matching requirements. In some examples, the length of the second portion 112b is designed to provide an impedance of 50 ohms. When a signal is input to the input port 111a of the coupler 110, the coupled components of the signal occur only on the first portions 112a, 112c of the coupling line 112, and no power output occurs on the second portion 112b.

Next, with reference to FIGS. 2 and 3 in combination, a process in which the coupled components of a signal reaches the calibration ports via two different paths when the signal is provided to the coupler 110 is described. Taking the coupler 110-2 as an example, when a signal is input from the input port 111a of the coupler 110-2, the coupled components are obtained at the first portion 112a and the first portion 112c of the coupling line of the coupler 110-2, respectively. Next, the main energy of the coupled component obtained at the first portion 112a of the coupling line of the coupler 110-2 passes through the coupling line of the coupler 110-1 to the first calibration port 120a in this order, and the main energy of the coupled component obtained at the first portion 112c of the coupling line of the coupler 110-2 passes through the coupling lines of the couplers 110-3 to 110-16 in this order to the second calibration port 120b. It is not necessary to ensure that the respective couplers 110 have identical circuit structures, since the difference in the circuit structures can be eliminated in the calibration algorithm based on the two coupled components at the first calibration port 120a and the second calibration port 120b.

In some embodiments, all input ports and all output ports of the transmission lines of the plurality of couplers are respectively located at the same side with respect to the region where the coupling lines of the plurality of couplers are present. For example, in the non-limiting example shown in FIG. 2, all of the input ports of the transmission lines of the plurality of couplers are near the upper side of FIG. 2 and all of the output ports are near the lower side of FIG. 2. This has the advantage that the input ports and the output ports are concentrated on one side of the substrate, respectively, for easy connection to other assemblies.

Figure 4:
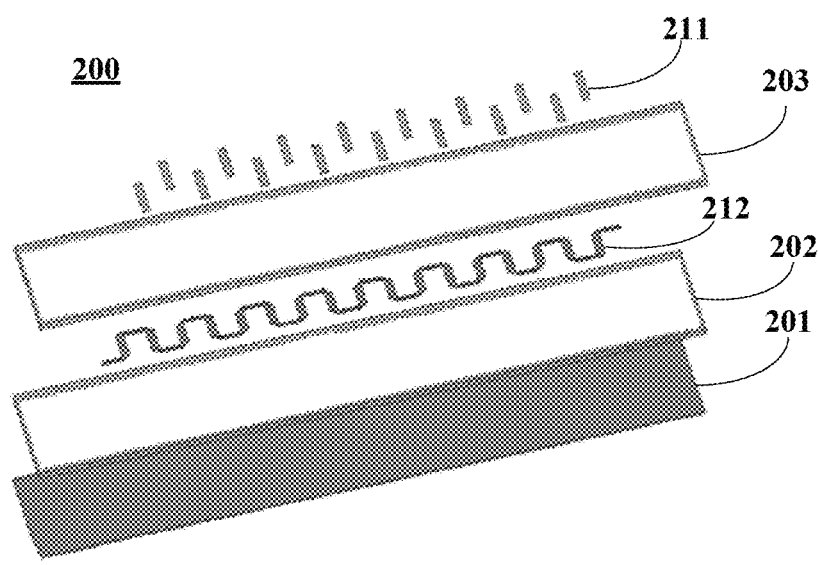
FIG. 4 is an exploded schematic view of a calibration circuit board according to some embodiments of the present disclosure.
Figure 5:
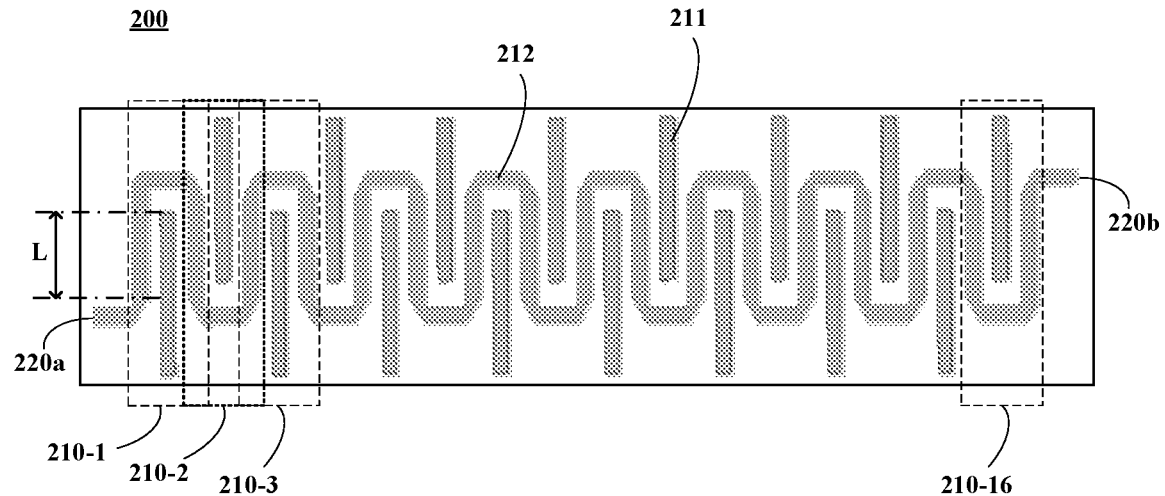
FIG. 5 is a top view of the calibration circuit board of FIG. 4.
Figure 6:
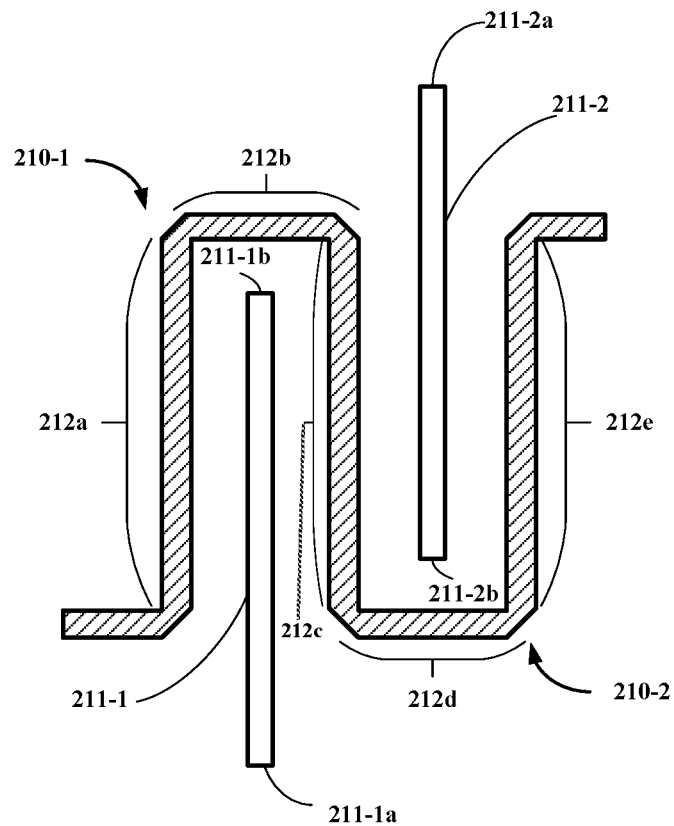
FIG. 6 is an enlarged schematic view of couplers included in the calibration circuit board of FIG. 4.

In some embodiments, a first portion of a coupling line of at least one of the plurality of couplers 110 has a common portion with a first portion of a coupling line of an adjacent coupler of the plurality of couplers. FIGS. 4-6 illustrate a calibration circuit board 200 according to some embodiments of the present disclosure. The calibration circuit board 200 is different from the calibration circuit board 100 in that the first portions of the coupling line of a coupler of the plurality of couplers of the calibration circuit board 200 have common portions with the first portions of the coupling lines of adjacent couplers of the plurality of couplers, and except for this, the calibration circuit board 200 may have substantially the same configuration as the calibration circuit board 100, and thus the above discussion about the calibration circuit board 100 is also applicable to the calibration circuit board 200, which is not repeated herein.

As shown in FIG. 4, the calibration circuit board 200 may include a first metal layer 201, a first substrate 202 disposed over the first metal layer 201, and a second substrate 203 disposed over the first substrate 202. The calibration circuit board 200 may further include coupling lines 212 disposed between the first substrate 202 and the second substrate 203 and transmission lines 211 disposed over the second substrate 203. Referring to FIG. 5, the calibration circuit board 200 includes a plurality of couplers 210-1, 210-2, 210-3, . . . , 210-16 (also sometimes referred to hereinafter collectively as couplers 210). The coupling lines of the plurality of couplers 210 are connected in series to provide two independent calibration ports 220a and 220b.

The first portions of the coupling lines of adjacent ones of the plurality of couplers of the calibration circuit board 200 have common portions. Referring now to FIG. 6, the adjacent couplers 210-1 and 210-2 are illustrated as examples. The coupler 210-1 includes a transmission line 211-1, at both ends of which an input port 211-1a and an output port 211-1b are provided, respectively, and the coupler 210-2 includes a transmission line 211-2, at both ends of which an input port 211-2a and an output port 211-2b are provided, respectively. Further, the coupling line of the coupler 210-1 includes two first portions 212a, 212c respectively located at both sides of the transmission line 211-1 thereof as viewed in a direction perpendicular to the calibration circuit board 200 and a second portion 212b connected between the two first portions 212a, 212c, and the coupling line of the coupler 210-2 includes two first portions 212c, 212e respectively located at both sides of the transmission line 211-2 thereof as viewed in a direction perpendicular to the calibration circuit board 200 and a second portion 212d connected between the two first portions 212c, 212e. The coupler 210-1 and the coupler 210-2 share the first portion 212c. As shown in FIG. 5, a plurality of couplers 210 share the serially connected coupling lines in a manner similar to that shown in FIG. 6. Since there is a common portion between the first portions of the coupling lines of adjacent couplers, the arrangement among the couplers can be more compact, reducing the size of the calibration circuit board, and in addition, since the path from the input port of the coupler to the calibration port is shortened, the insertion loss of the calibration port with respect to the input port is also reduced.

In some embodiments, the calibration circuit board according to the present disclosure may further include: a third substrate disposed over the second substrate such that one of the transmission lines and the coupling lines of the plurality of couplers disposed over the second substrate is located between the second substrate and the third substrate; and a second metal layer disposed over the third substrate and configured to be grounded.

Figure 7:
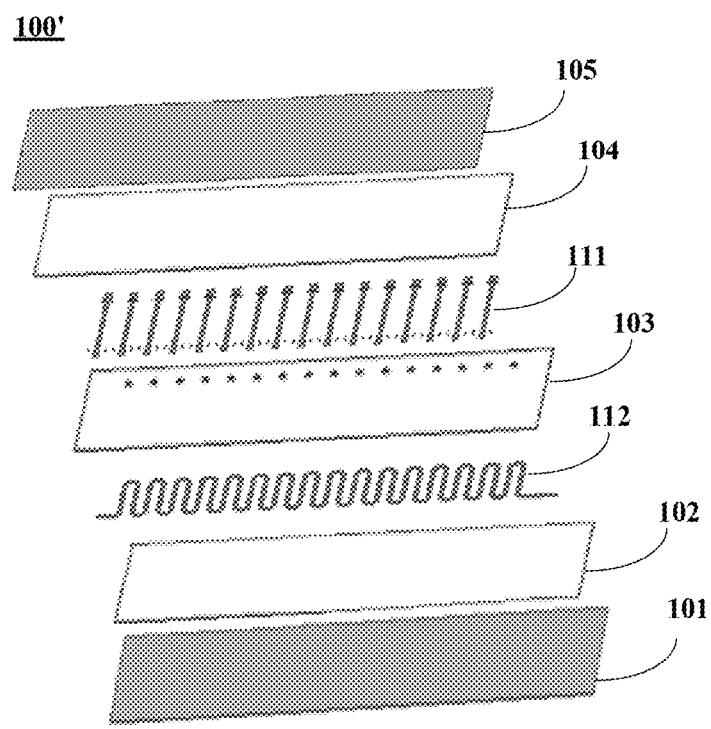
FIG. 7 is an exploded schematic view of a calibration circuit board according to some embodiments of the present disclosure.
Figure 8:
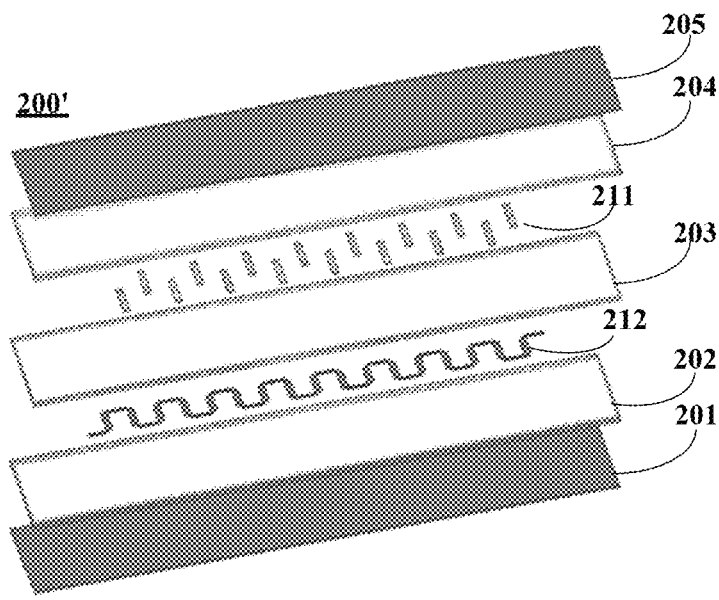
FIG. 8 is an exploded schematic view of a calibration circuit board according to some embodiments of the present disclosure.

For example, as compared to the calibration circuit board 100, the calibration circuit board 100' as shown in FIG. 7 further includes a third substrate 104 disposed over the second substrate 103 and a second metal layer 105 disposed over the third substrate 104, in which the transmission lines 111 are disposed between the second substrate 103 and the third substrate 104. As compared to the calibration circuit board 200, the calibration circuit board 200' shown in FIG. 8 further includes a third substrate 204 disposed over the second substrate 203 and a second metal layer 205 disposed over the third substrate 204, in which the transmission lines 211 are disposed between the second substrate 203 and the third substrate 204. The third substrate 104, 204 may be similar to the first substrate and the second substrate as described above, and the second metal layer 105, 205 may be similar to the first metal layer as described above, which will not be described herein again. The closed design of the calibration circuit boards 100', 200' is more resistant to external interference than an open design of the calibration circuit boards 100, 200 where the transmission lines are exposed to the outside, especially when the frequencies of the signals increase, which reduces amplitude/phase fluctuations of the signals.

In some embodiments, the calibration circuit board may be implemented as a multilayer printed circuit board. In some embodiments, the calibration circuit board may be implemented to include three separate boards, wherein a first board may include a first metal layer and a first substrate, a second board may include coupling lines, a second substrate, and transmission lines, and a third board may include a third substrate and a second metal layer. For example, as a non-limiting example, the first board and the third board may be dielectric plates with metal layers deposited on their surfaces, and the second board may be a dielectric plate with metal lines formed on its upper and lower sides. When a main functional component of the calibration circuit board, such as a coupler, fails, only the second board may be replaced without replacing the first board and the third board, thereby facilitating repair and/or maintenance and saving costs.

Figure 9:
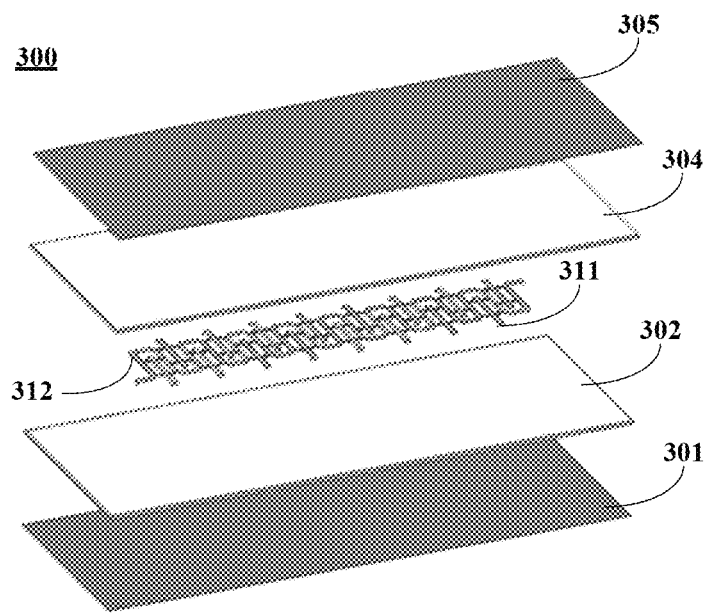
FIG. 9 is an exploded schematic view of a calibration circuit board according to some embodiments of the present disclosure.

In some embodiments, the calibration circuit board including the third substrate may not include the second substrate, such that the transmission lines and the coupling lines of the plurality of couplers are collectively disposed between the first substrate and the third substrate. As shown in FIG. 9, for example, the calibration circuit board 300 differs from the calibration circuit board 200' in that it does not include the second substrate 203. As shown in FIG. 9, the calibration circuit board 300 includes a first metal layer 301, a first substrate 302 disposed over the first metal layer 301, a third substrate 304 disposed over the first substrate 302, and a second metal layer 305 disposed over the third substrate 304. The transmission lines 311 and the coupling lines 312 of the plurality of couplers are commonly disposed between the first substrate 302 and the third substrate 304. Such a closed design is resistant to external interference, especially when the frequencies of the signals increase, thereby reducing amplitude/phase fluctuations of the signals.

Another aspect of the present disclosure provides an antenna apparatus, comprising: a plurality of radiating units; a plurality of RF ports; and the calibration circuit board according to any embodiment of the present disclosure, wherein the input port of each coupler of the calibration circuit board is connected to a respective one of the plurality of RF ports, and the output port of each coupler of the calibration circuit board is connected to a respective one of the plurality of radiating units.

Figure 10:
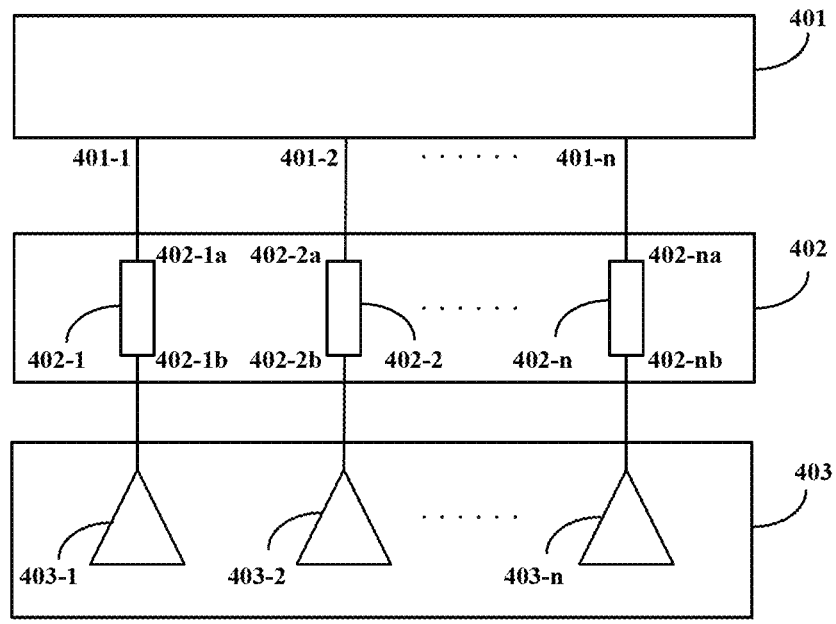
FIG. 10 is a schematic structural diagram of an antenna apparatus according to some embodiments of the present disclosure.

An antenna apparatus 400 according to some embodiments of the present disclosure is now described with reference to FIG. 10. It should be noted that other components may be present in an actual antenna apparatus, and are not shown in the drawings and discussed herein in order to avoid obscuring the gist of the present disclosure.

The antenna apparatus 400 may comprise an RF processing module 401, a calibration circuit board 402 and an antenna array 403. The antenna array 403 may comprise a plurality of radiating units 403-1, 403-2, . . . , 403-n (n is a positive integer), each radiating unit may comprise a radiating element or a vertically arranged column of multiple radiating elements. The RF processing module 401 may generally comprise an antenna interface unit, an RF transceiver, a beam forming network, and the like. For example, when the antenna apparatus 400 is operating in a transmitting mode, the antenna interface unit may receive a signal to be transmitted from a baseband unit, divide the signal into a number of identical sub-components (e.g., the number of sub-components may be equal to the number of radiating units 403-1, 403-2, . . . , 403-n), and apply a predetermined gain and phase to each sub-component, and then provide the respective sub-components to the corresponding RF transceiver. The individual sub-components of the signal are converted to analog signals at the RF transceiver and then reach the corresponding radiating units via the beam forming network. The signals radiated from the radiating units are interferometrically superimposed to form a desired beam pattern. The RF processing module 401 provides a plurality of RF ports 401-1, 401-2, . . . , 401-n (n is a positive integer) for providing signals to the plurality of radiating units 403-1, 403-2, . . . , 403-n, respectively.

The calibration circuit board 402 may be the calibration circuit board according to any embodiment of the present disclosure, which may be disposed between the RF processing module 401 and the antenna array 403. The calibration circuit board 402 may comprise a plurality of couplers 402-1, 402-2, . . . , 402-n (n is a positive integer). The coupling lines of the plurality of couplers 402-1, 402-2, . . . , 402-n are connected in series with each other (not specifically depicted in FIG. 10). The input ports 402-1a, 402-2a, . . . , 402-na of the respective couplers 402-1, 402-2, . . . , 402-n of the calibration circuit board 402 may be connected to respective ones of the plurality of RF ports 401-1, 401-2, . . . , 401-n, and the output ports 402-1b, 402-2b, 402-nb of the respective couplers 402-1, 402-2, . . . , 402-n of the calibration circuit board may be connected to respective ones of the plurality of radiating units 403-1, 403-2, . . . , 403-n.

For example, to calibrate the transmitting channels, calibration test signals are transmitted from the RF ports 401-1, 401-2, . . . , 401-n to the radiating units 403-1, 403-2, . . . , 403-n. A portion of the power of the calibration test signal transmitted on the transmitting channels is extracted via the couplers 402-1, 402-2, . . . , 402-n of the calibration circuit board 402 and output from the calibration ports of the calibration circuit board.

The gains and phases of all the transmitting/receiving channels of the antenna apparatus 400 can be accurately monitored and adjusted so that a desired beam pattern can be formed. Moreover, the antenna apparatus 400 according to the embodiments of the present disclosure can realize more ports while having a small size, thereby meeting the requirements of high integration and miniaturization of the antenna.

The terms "left," "right," "front," "back," "top," "bottom," "upper," "lower," "high", "low", and the like in the description and in the claims, if any, are used for descriptive purposes and not necessarily for describing permanent relative positions. It is to be understood that the terms so used are interchangeable under appropriate circumstances such that the embodiments of the disclosure described herein are, for example, capable of operation in other orientations than those illustrated or otherwise described herein. For example, when the apparatus in the figures is turned upside down, features described as "over" other features may be described as "below" other features at this time. The apparatus may also be otherwise oriented (rotated 90 degrees or at other orientations) and the relative spatial relationships may be interpreted accordingly.

In the description and claims, an element described as being "over," "attached to," "connected to," "coupled to," or "contacting" another element or the like may be directly over, directly attached to, directly connected to, directly coupled to or directly contact the other element, or one or more intermediate elements may be present. In contrast, when an element is referred to as being "directly over", "directly attached to," "directly connected to," "directly coupled to," or "directly contacting" another element, there are no intermediate elements present. In the description and claims, one feature may be arranged to be "adjacent to" another feature, which may mean that the one feature has a portion that overlaps with the adjacent feature or has a portion above or below the adjacent feature.

As used herein, the term "exemplary" means "serving as an example, instance, or illustration," and not as a "model" that is to be reproduced exactly. Any implementation exemplarily described herein is not necessarily to be construed as preferred or advantageous over other implementations. Furthermore, the present disclosure is not restricted by any expressed or implied theory presented in the technical field, background, summary of the invention, or detailed description.

As used herein, the term "substantially" is intended to encompass any minor variations due to design or manufacturing imperfections, tolerances of the devices or elements, environmental influences and/or other factors. The term "substantially" also allows for differences from a perfect or ideal situation due to parasitic effect, noise, and other practical considerations that may exist in a practical implementation.

In addition, the terms "first," "second," and the like may also be used herein for reference purposes only, and thus are not intended to be limiting. For example, the terms "first," "second," and other such numerical terms referring to structures or elements do not imply a sequence or order unless clearly indicated by the context.

It will be further understood that the term "include/comprise," when used herein, specify the presence of stated features, entireties, steps, operations, units, and/or components, but do not preclude the presence or addition of one or more other features, entireties, steps, operations, units, components, and/or a combination thereof.

In the present disclosure, the term "providing" is used broadly to encompass all ways of obtaining an object, and thus "providing an object" includes, but is not limited to, "purchasing," "preparing/manufacturing," "arranging/setting," "installing/assembling," and/or "ordering" the object, and the like.

As used herein, the term "and/or" includes any and all combinations of one or more of the associated listed items. The terminology used herein is for the purpose of describing particular embodiments only and is not intended to limit the present disclosure. As used herein, the singular forms "a," "an" and "the" are intended to include the plural forms as well, unless the context clearly indicates otherwise.

Those skilled in the art shall appreciate that the boundaries between the above-described operations are merely illustrative. Multiple operations may be combined into a single operation, a single operation may be distributed in additional operations, and operations may be performed at least partially overlapping in time. Moreover, alternative embodiments may include multiple instances of a particular operation, and the order of operations may be altered in various other embodiments. However, other modifications, variations, and alternatives are also possible. The aspects and elements of all embodiments disclosed above may be combined in any manner and/or in combination with aspects or elements of the other embodiments to provide multiple additional embodiments. The specification and drawings are, accordingly, to be regarded in an illustrative rather than a restrictive sense.

Although some specific embodiments of the present disclosure have been described in detail by way of example, it should be understood by those skilled in the art that the above examples are for illustration only and are not intended to limit the scope of the present disclosure. The various embodiments disclosed herein may be combined in any manner without departing from the spirit and scope of the present disclosure. Those skilled in the art will also appreciate that various modifications might be made to the embodiments without departing from the scope and spirit of the present disclosure. The scope of the present disclosure is defined by the attached claims.

What is claimed is:

1. A calibration circuit board for an antenna, comprising:
a first metal layer;
a first substrate over the first metal layer;
a second substrate over the first substrate;
a third substrate over the second substrate;
a second metal layer over the third substrate; and
a plurality of couplers, each coupler comprising:
    a transmission line provided with an input port and an output port at respective ends thereof; and
    a coupling line coupled with the transmission line and including two first portions respectively located at both sides of the transmission line, as viewed from a direction perpendicular to the calibration circuit board, and a second portion connected between the two first portions,
wherein the coupling lines of the plurality of couplers are connected in series to provide a first calibration port and a second calibration port,
wherein one of the transmission lines and the coupling lines of the plurality of couplers is between the first substrate and the second substrate, and the other of the transmission lines and the coupling lines of the plurality of couplers is over the second substrate and between the second substrate and the third substrate, and
wherein the calibration circuit board does not comprise the second substrate, such that the transmission lines and the coupling lines of the plurality of couplers are collectively between the first substrate and the third substrate.

2. The calibration circuit board of claim 1, wherein the coupling lines of the plurality of couplers are between the first substrate and the second substrate, and the transmission lines of the plurality of couplers are over the second substrate.

3. The calibration circuit board of claim 1, wherein a first portion of a coupling line of at least one of the plurality of couplers has a common portion with a first portion of a coupling line of an adjacent coupler of the plurality of couplers.

4. The calibration circuit board of claim 1, wherein the transmission lines of the respective ones of the plurality of couplers are parallel to each other, and the two first portions of the coupling line of each of the plurality of couplers are coupled in parallel to the transmission line of that coupler.

5. The calibration circuit board of claim 4, wherein the transmission line of each of the plurality of couplers is in between the two first portions of the coupling line of that coupler.

6. The calibration circuit board of claim 4, wherein the calibration circuit board is configured to operate on radio frequency signals in a first frequency band, and wherein a length of at least one of the first portions of the coupling line of each of the plurality of couplers is equal to a quarter wavelength of a center frequency of the first radio frequency band.

7. The calibration circuit board of claim 4, wherein a length of the second portion of the coupling line of each of the plurality of couplers is configured to meet impedance matching requirements.

8. The calibration circuit board of claim 1, wherein the transmission lines of the plurality of couplers extend, as viewed in the direction perpendicular to the calibration circuit board, beyond a region where the coupling lines of the plurality of couplers are present.

9. The calibration circuit board of claim 8, wherein all input ports of the transmission lines of the plurality of couplers are respectively located at a first side of a region where the coupling lines of the plurality of couplers are present, and wherein all output ports of the transmission lines of the plurality of couplers are respectively located at a second side of the region where the coupling lines of the plurality of couplers are present.

10. The calibration circuit board of claim 1, wherein the calibration circuit board is implemented as a multilayer printed circuit board.

11. The calibration circuit board of claim 1, wherein the transmission lines and the coupling lines of the plurality of couplers are metal traces formed on upper and lower sides of the second substrate, respectively.

12. An antenna apparatus, comprising:
 a plurality of radiating units;
 a plurality of radio frequency ports; and
 a calibration circuit board, comprising:
 a first metal layer;
 a first substrate over the first metal layer;
 a second substrate over the first substrate;
 a third substrate over the second substrate;
 a second metal layer over the third substrate; and
 a plurality of couplers, each coupler comprising:
 an input port;
 an output port;
 a transmission line having first and second ends at the input port and output port, respectively; and
 a coupling line coupled with the transmission line and including two first portions respectively located at both sides of the transmission line, as viewed from a direction perpendicular to the calibration circuit board, and a second portion connected between the two first portions,
 wherein the coupling lines of the plurality of couplers are connected in series to provide a first calibration port and a second calibration port,
 wherein one of the transmission lines and the coupling lines of the plurality of couplers is between the first substrate and the second substrate, and the other of the transmission lines and the coupling lines of the plurality of couplers is over the second substrate and between the second substrate and the third substrate,
 wherein the calibration circuit board does not comprise the second substrate, such that the transmission lines and the coupling lines of the plurality of couplers are collectively between the first substrate and the third substrate, and
 wherein the input port of each coupler of the calibration circuit board is connected to a respective one of the plurality of radio frequency ports, and the output port of each coupler of the calibration circuit board is connected to a respective one of the plurality of radiating units.

13. The antenna apparatus of claim 12, wherein the coupling lines of the plurality of couplers are between the first substrate and the second substrate, and the transmission lines of the plurality of couplers are over the second substrate.

14. The antenna apparatus of claim 12, wherein a first portion of a coupling line of at least one of the plurality of couplers has a common portion with a first portion of a coupling line of an adjacent coupler of the plurality of couplers.

15. The antenna apparatus of claim 12, wherein the transmission lines of the respective ones of the plurality of couplers are parallel to each other, and the two first portions of the coupling line of each of the plurality of couplers are coupled in parallel to the transmission line of that coupler.

16. The antenna apparatus of claim 15, wherein the transmission line of each of the plurality of couplers is in between the two first portions of the coupling line of that coupler.

17. The antenna apparatus of claim 15, wherein the calibration circuit board is configured to operate on radio frequency signals in a first frequency band, and wherein a length of at least one of the first portions of the coupling line of each of the plurality of couplers is equal to a quarter wavelength of a center frequency of the first radio frequency band.

18. The antenna apparatus of claim 12, wherein the transmission lines of the plurality of couplers extend, as viewed in the direction perpendicular to the calibration circuit board, beyond a region where the coupling lines of the plurality of couplers are present.

* * * * *